(12) United States Patent
Hu et al.

(10) Patent No.: US 11,152,892 B2
(45) Date of Patent: Oct. 19, 2021

(54) CALIBRATION OF AUDIO POWER AMPLIFIER DC OFFSET

(71) Applicant: Beken Corp Shenzhen, Shenzhen (CN)

(72) Inventors: Desheng Hu, Shanghai (CN); Donghui Gao, Shanghai (CN); Jiazhou Liu, Shanghai (CN); Dawei Guo, Shanghai (CN)

(73) Assignee: Beken Corp Shenzhen, Shenzhen (CN)

( * ) Notice: Subject to any disclaimer, the term of this patent is extended or adjusted under 35 U.S.C. 154(b) by 79 days.

(21) Appl. No.: 16/795,285

(22) Filed: Feb. 19, 2020

(65) Prior Publication Data
US 2021/0184629 A1    Jun. 17, 2021

(30) Foreign Application Priority Data
Dec. 17, 2019 (CN) .......................... 201911314804.8

(51) Int. Cl.
| | |
|---|---|
| *H03F 3/45* | (2006.01) |
| *H03F 1/02* | (2006.01) |
| *H03M 1/66* | (2006.01) |
| *H03F 3/21* | (2006.01) |
| *H03F 3/181* | (2006.01) |

(52) U.S. Cl.
CPC ............... *H03F 1/02* (2013.01); *H03F 3/181* (2013.01); *H03F 3/21* (2013.01); *H03M 1/66* (2013.01)

(58) Field of Classification Search
CPC ... H03F 1/02; H03F 3/21; H03F 3/181; H03F 1/302; H03F 1/34; H03F 1/30; H03F 1/301; H03F 2200/153; H03F 3/45475; H03F 3/45183; H03F 3/45479; H03F 1/3211; H03F 3/45; H03F 2203/30036; H03M 1/66
USPC ................................................. 330/259, 290
See application file for complete search history.

(56) References Cited

U.S. PATENT DOCUMENTS

| | | | |
|---|---|---|---|
| 10,236,827 B2* | 3/2019 | Zhu ......................... H03F 3/21 |
| 2013/0127531 A1* | 5/2013 | Lesso ..................... H03F 3/217 |
| | | | 330/251 |
| 2015/0171885 A1* | 6/2015 | Juang ................. H03F 3/45183 |
| | | | 341/118 |

\* cited by examiner

*Primary Examiner* — Khanh V Nguyen
(74) *Attorney, Agent, or Firm* — Schwegman Lundberg & Woessner, P.A.

(57) ABSTRACT

A method and a system of calibrating a DC offset voltage on a resistor load are provided. The system may include a first operational amplifier, a second operational amplifier, a comparator, a digital signal processor, and a digital to analog convertor. At a calibration mode, under control of the digital signal processor, the system may utilize open-loop high gain characteristics of the first operational amplifier and the comparator to automatically detect and calibrate the DC offset voltage. At an operation mode, the system may automatically compensate the DC offset voltage based on the calibration of the DC offset voltage. In this way, the system and the method can automatically detect, calibrate, and compensate the DC offset voltage with reduced cost and technical complexity.

17 Claims, 3 Drawing Sheets

CALIBRATION OF AUDIO POWER AMPLIFIER DC OFFSET

CROSS REFERENCE TO RELATED APPLICATIONS

This application claims priority to CN 201911314804.8 filed Dec. 17, 2019, which is incorporated herein by reference.

TECHNICAL FIELD

The present disclosure generally relates to calibration of a power amplifier DC offset, and more particularly, but not exclusively, to calibration of an audio power amplifier DC offset.

BACKGROUND

Power amplifiers (such as audio power amplifiers) including operational amplifiers (op-amps) are widely used in audio systems for example. Due to various reasons, a typical audio power amplifier may suffer a DC offset problem. Thus, even without a DC input voltage, the audio power amplifier may create a DC offset voltage to a resistor load (such as a speaker), which can lead to adverse effects (such as pop-noises produced when turning-on and turning-off the audio power amplifier). Therefore, an effective and cost-efficient way of detecting and compensating the DC offset voltage on the resistor load becomes highly desirable.

BRIEF DESCRIPTION OF THE APPLICATION

According to an embodiment, in a method of calibrating a DC offset voltage of a system, the system comprises a first operational amplifier (AMP1), a second operational amplifier (AMP2) electrically coupled to the first operational amplifier, a comparator (U3), a digital signal processor (U2), and a digital to analog convertor (U1) electrically coupled to the first operational amplifier, wherein the digital signal processor is electrically coupled between the digital to analog convertor and the comparator, and wherein at a calibration mode. The method comprises: connecting a first input node and a second input node of the first operational amplifier to a common mode voltage (Vcom); initially outputting by the digital signal processor a digital code (D[7:0]) having a number of bits at an initial digital value (Vmid) to cause the digital to analog convertor to output a first compensation current (Icp) and a second compensation current (Icn) respectively to the first input node and the second input node of the first operational amplifier; comparing by the comparator for a number of comparisons a first output voltage and a second output voltage from the first operational amplifier to output each time a digital logical output (0 or 1) to the digital signal processor, wherein the number of comparisons being equal to a number of bits of the digital code; responsive to each digital logical output, adjusting by the digital signal processor the digital code by half of the digital code; and saving the digital code as a compensation voltage value in the digital signal processor after completion of the number of comparisons.

In another embodiment, the system comprises a first operational amplifier (AMP1) having a first input node (+) and a second input node (−); a comparator (U3) configured to couple to the first operational amplifier during a calibration mode configured to make a digital logical output (0, 1); a digital signal processor (U2) configured to receive the determination (0, 1) from the comparator and output a digital code (D[7:0]) responsive to the determination during the calibration mode; a digital to analog convertor (U1) configured to convert the digital code into an analog value during the calibration mode, and electrically coupled to the first operational amplifier; and a first feedback resistor (Rf1) and a second feedback resistor (Rf2) coupled in parallel between the digital to analog convertor and a resistor load, wherein the digital signal processor is electrically coupled between the digital to analog convertor and the comparator, and wherein during the calibration mode, the first input node and the second input node of the first operational amplifier being supplied with a common mode voltage, the digital to analog convertor is configured to determine a first compensation current (Icp) and a second compensation current (Icn) respectively to the first input node and the second input node so as to create a compensation voltage (Vcmp) on the resistor load (RL) to compensate a DC offset voltage (Vas) on the resistor load.

BRIEF DESCRIPTION OF THE DRAWINGS

Non-limiting and non-exhaustive embodiments of the present application are described with reference to the following figures, wherein like reference numerals refer to like parts throughout the various views unless otherwise specified.

DETAILED DESCRIPTION OF THE ILLUSTRATED EMBODIMENTS

Various aspects and examples of the application will now be described. The following description provides specific details for a thorough understanding and enabling description of these examples. Those skilled in the art will understand, however, that the application may be practiced without many of these details.

Additionally, some well-known structures or functions may not be shown or described in detail, so as concise purpose and to avoid unnecessarily obscuring the relevant description.

The terminology used in the description presented below is intended to be interpreted in its broadest reasonable manner, even though it is being used in conjunction with a detailed description of certain specific examples of the application. Certain terms may even be emphasized below, however, any terminology intended to be interpreted in any restricted manner will be overtly and specifically defined as such in this Detailed Description section.

Without loss of generality, reference will be made to illustrative embodiments by taking a system and a method of recovering pairing information of wirelessly communicated devices as example. Those of ordinary skills in the art understand that this is only to describe the application clearly and adequately, rather than limit the scope of the application, which is defined by the appended claims.

An audio power amplifier including operational amplifiers (op-amps) on a chip may work at one of two modes: a normal operation mode (an operation mode) and a DC offset voltage calibration mode (a calibration mode). At the calibration mode, under the control of a digital signal processor (a digital control logic), the audio power amplifier may utilize open-loop high gain characteristics of the op amps on the chip to automatically detect a DC offset voltage of the audio power amplifier on a resistor load, and thus may calibrate the DC offset voltage. At the operation mode, the audio power amplifier may automatically compensate the DC offset voltage on the resistor load based on the detection and calibration of the DC offset voltage on the resistor load. In this way, the audio power amplifier can automatically detect, calibrate, and compensate the DC offset voltage with reduced cost and technical complexity.

Figure 1:
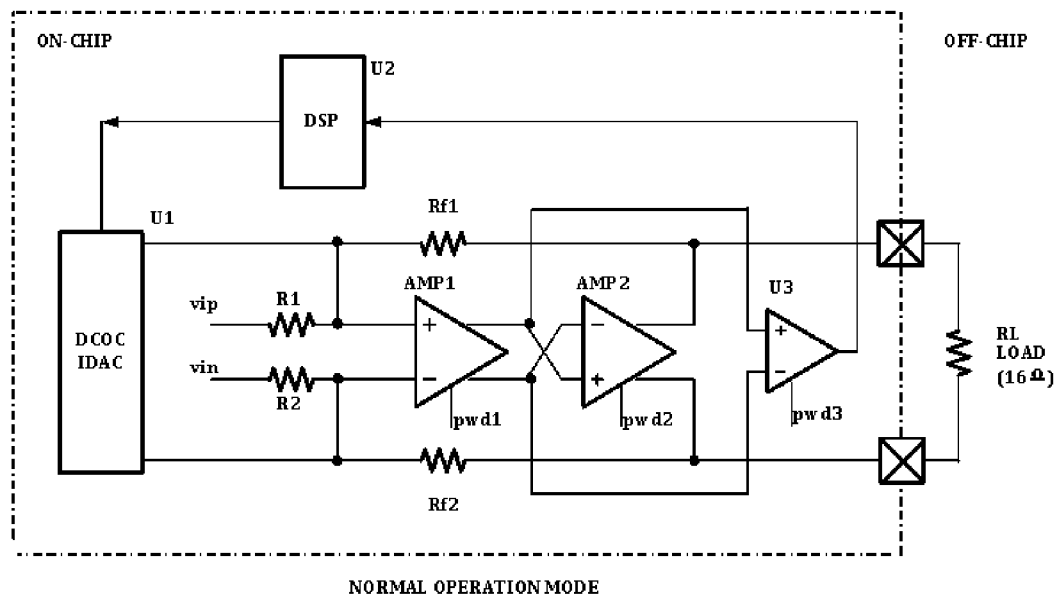
FIG. 1 is a diagram illustrating an audio power amplifier at an operation mode according to an embodiment.
Figure 2:
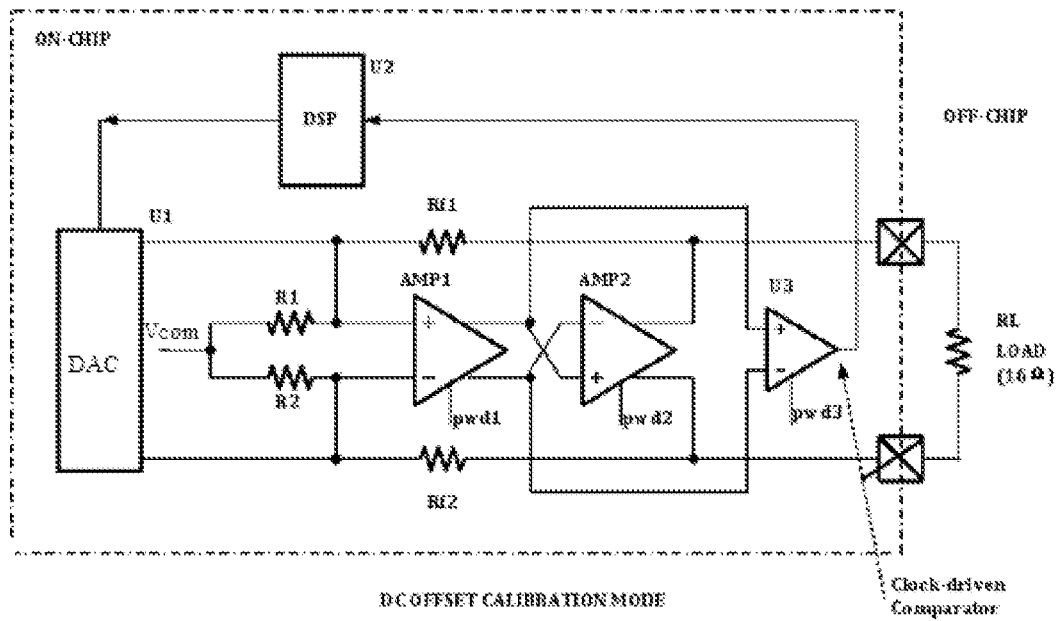
FIG. 2 is a diagram illustrating an audio power amplifier at a calibration mode according to an embodiment.

As shown in FIG. 1 and FIG. 2, an audio power amplifier 100 may include a first operational amplifier AMP1, a second operational amplifier AMP2 electrically coupled to the first operational amplifier AMP1, a digital to analog converter (DAC) U1, a digital signal processor (DSP) U2, and a comparator U3. The DSP U2 is electrically coupled between the DAC U1 and the comparator U3. The DAC U1 is electrically coupled to the first operational amplifier AMP1. The audio power amplifier 100 may also include a first feedback resistor Rf1 and a second feedback resistor Rf2 coupled in parallel between the DAC U1 and a resistor load RL (such as a speaker). The first feedback resistor Rf1 and the second feedback resistor Rf2 are designed to have identical resistance values. The first operational amplifier AMP1 and the second operational amplifier AMP2 each may include a positive input node (+) and a negative input node (−). The first operational amplifier AMP1 may include a first input resistor R1 and a second input resistor R2 designed to have identical resistance values.

FIG. 1 is a diagram illustrating the audio power amplifier 100 at an operation mode according to an embodiment. At the operation mode, input voltage signals Vip and Vin are respectively provided to the positive input node (+) and the negative input node (−) of the first operational amplifier AMP1, and the first operational amplifier AMP1 and the second operational amplifier AMP2 are coupled in serial so as to function as a power amplifier to provide an amplified signal to the resistor load RL.

At the operation mode, an enable signal pwd1 of the first operational amplifier AMP1 and an enable signal pwd2 of the second operational amplifier AMP2 are both set low so as to enable both the first operational amplifier AMP1 and the second operational amplifier AMP2, and an enable signal pwd3 of the comparator U3 is set high so as to disable the comparator U3.

At the operation mode, due to various reasons, such as mis-matchings among the first input resistor R1 and the second input resistor R2, as well as the first feedback resistor Rf1 and the second feedback resistor Rf2, in the audio power amplifier 100, a DC offset voltage Vos can be created on the resistor load RL. The DC offset voltage Vos can lead to adverse effects, such as producing pop noises when turning-on and turning-off the audio power amplifier 100. Thus, a compensation to the adverse DC offset voltage Vos on the resistor load RL is required.

At the operation mode, to compensate the DC offset voltage Vos on the resistor load RL, the DAC U1 may receive a digital code Vd from the DSP U2, and convert the digital code Vd to an analog compensation voltage Va that may create compensation currents Icp and Icn to respectively flow through the first feedback resistor Rf1 and the second feedback resistor Rf2 so as to create a DC compensation voltage Vcmp on the resistor load RL. The DC compensation voltage Vcmp having a polarity opposite to that of the DC offset voltage Vos and having a value almost the same as that of the DC offset voltage Vos so as to compensate the DC offset voltage Vos on the resistor load RL. In this way, the level of the pop noises created when turning-on and turning-off the audio power amplifier 100 can be greatly lowered.

FIG. 2 is a diagram illustrating the audio power amplifier 100 at a calibration mode according to an embodiment. The digital code Vd can be determined and then be saved in the DSP U2 at the calibration mode as explained below.

At the calibration mode, the enable signal pwd1 of the first operational amplifier AMP1 and the enable signal pwd3 of the comparator U3 are set low to enable the first operational amplifier AMP1 and the comparator U3, and the enable signal pwd2 of the second operational amplifier AMP2 is set high to disable the second operational amplifier AMP2. Thus, at the calibration mode, the first operational amplifier AMP1 and the comparator U3 are under an operation state.

At the calibration mode, the first input resistors R1 and the second input resistors R2 are connected to a common mode voltage Vcom, and thus there is no input DC voltage to the first operational amplifier AMP1. However, as explained above, due to mis-matchings e.g., among the first input resistor R1 and the second input resistor R2, as well as the first feedback resistor Rf1 and the second feedback resistor Rf2, an adverse DC offset voltage Vos can be created on the resistor load RL and needs to be detected at the calibration mode in order to be compensated at the operation mode.

At the calibration mode, the first operational amplifier AMP1 may open-loop amplify the DC offset voltage Vos in a very high gain (for example, designed at a level of 10,000 times), and the comparator U3 may amplify in a high gain (for example, designed at a level of 10 times to 100 times), so that the overall open-loop gain at the calibration mode can reach a level of e.g., 100,000 magnitude. Given an operating voltage of 1.5V, a DC offset voltage Vos at a level 15 uV may cause the comparator U3 to receive a sufficiently amplified DC offset voltage Vos1 that can produce a reliable digital logical output (1 or 0).

At the calibration mode, a digital code Vd can be determined and saved in the DSP U2. At the operation mode, the digital code Vd can be converted into an analog compensation voltage Va, which can be used by the audio power amplifier 100 to compensate the DC offset voltage Vos on the resistor load RL. In an embodiment, the digital code Vd can be represented by a digital value (a digital character) D[7:0] having 8 bits. The digital value is not limited to have 8 bits, and may have 16, 32 or 64 bits for example.

At the calibration mode, the DC offset voltage Vos on the resistor load RL is equivalent to a DC offset voltage Vos applied to the first and second input nodes of the first operational amplifier AMP1, which can be amplified by the first operational amplifier AMP1 to an amplified voltage Vos1, and output to the comparator U3. The amplified voltage Vos1 output to the comparator U3 is sufficient to cause the comparator U3 to make a reliable digital logical output (0 or 1) to output to the DSP U2.

Given the Vos1 being positive (e.g., +5 mv), the comparator U3 may output a digital logical output 1, and given the Vos1 being negative (e.g., −3 mv), the comparator U3 may output a digital logical output 0.

Upon receiving the digital logical output (0 or 1) from the comparator U3, the DSP U2 may adjust (increase or decrease) the digital code Vd, and then may output the adjusted digital code Vd to the DAC U1.

The DAC U1 may receive and convert the digital code Vd to an analog compensation voltage Va, which may adjust the compensation currents Icp and Icn running through the first feedback resistor Rf1 and the second feedback resistor Rf2 so as to adjust the compensation voltage Vcmp to compensate the DC offset voltage Vos on the resistor load RL.

At the calibration mode, the process of adjusting the digital code Vd D[7:0] can be repeatedly performed for a plurality of times in order to determine a final digital code Vd. The final digital code Vd can be determined and saved in the DSP U2 at the calibration mode, and the final digital code Vd can be used to compensate the DC offset voltage Vos on the resistor load RL at the operation mode.

In an embodiment, the adjusting process of the digital code Vd can be repeatedly performed for 8 times to determine the final digital code Vd at the calibration mode, since the number of times of adjusting the digital code Vd equals the number of bits of the digital code Vd (e.g., D[7:0] has 8 bits).

Figure 3:
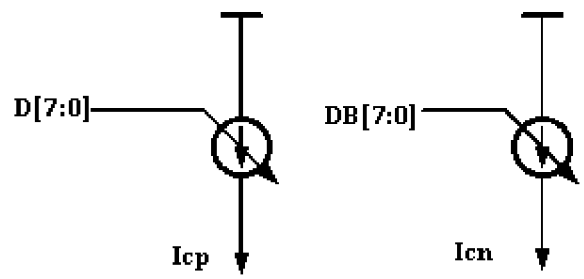
FIG. 3 is a diagram illustrating a working principle of a digital signal processor (DSP) of the system as shown in FIG. 2 according to an embodiment.

FIG. 3 is a diagram illustrating a working principle of a digital signal processor of the audio power amplifier according to an embodiment. The compensation currents Icp and Icn are actually controlled by a digital code Vd D[7:0], which can be adjusted by the DSP U2 at the calibration mode. The digital code D[7:0] have e.g., 8 bits. The highest digital code D[7:0] is 1111,1111, the lowest digital code D[7:0] is 0000,0000, and the middle digital code D[7:0] is 1000,0000.

When the digital code D[7:0] increases, the compensation current Icp running through the first feedback resistor Rf1 will increase, and the compensation current Icn running through the second feedback resistor Rf2 will decrease. While when the digital code D[7:0] decreases, the compensation current Icp running through the first feedback resistor Rf1 will decrease, and the compensation current Icn running through the second feedback resistor Rf2 will increase. In this way, the compensation voltage Vcmp on the resistor load RL can be adjusted by the digital code D[7:0].

Figure 4:
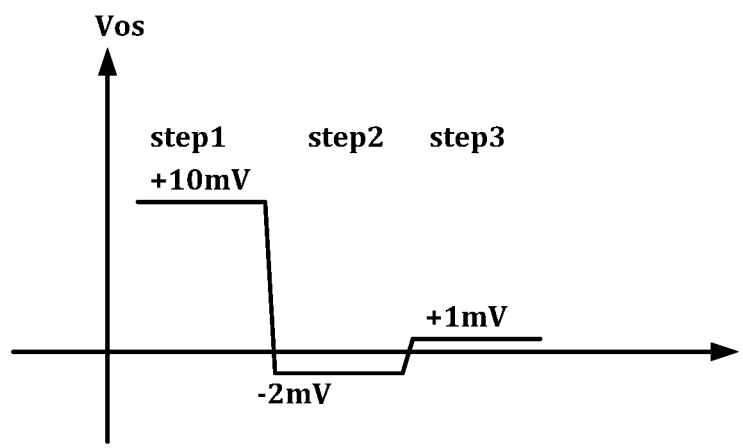
FIG. 4 is a diagram illustrating processes of calibrating an audio power amplifier DC offset according to an embodiment.

FIG. 4 is a diagram illustrating processes of calibrating an audio power amplifier DC offset according to an embodiment.

At the calibration mode, for example, design parameters can be as follows: R1=R2=5 Kohm, Rf1=Rf2=10 Kohm, and the gain of the first operational amplifier AMP1=10000. Thus, the combination of the first operational amplifier AMP1 and the comparator U3 can be considered as a highly magnifying comparator. The equivalent DC offset voltage Vos to the first operational amplifier AMP1 is supposed to be +10 mV for example.

Initially, at step 1, the digital code D[7:0] is set at median value such that D[7:0]=1000,000 as an initial digital code, which is between the highest digital code 1111,1111 and the lowest digital code 0000,0000, such that the first compensation current Icp and the second compensation current Icn have the same current values (e.g., Icp=0.5 uA, Icn=0.5 uA), and the first operational amplifier AMP1 amplifies the equivalent DC offset voltage Vos of +10 mv by a gain of 10000 times and outputs an amplified DC offset voltage Vos1 to the comparator U3 to be compared with 0. Since the amplified DC offset voltage Vos1 is greater than 0, the comparator U3 outputs a digital logical output 1 to the DSP U2.

After that, at step 2, upon obtaining the digital logical output 1, the DSP U2 adjusts the digital code D[7:0] in a decreasing direction (a first direction) by a half of the initial digital code such that the current digital code D[7:0]=0100, 0000, and thus Icp=0.3 uA, and Icn=0.7 uA. Due to the first compensation current Icp and the second compensation current Icn, the equivalent DC offset voltage Vos on the first operational amplifier AMP1 will become −2 mV, and will be amplified by the first operational amplifier AMP1 by a gain of 10000 times to output the amplified DC offset voltage Vos1 to the comparator U3 to be for compared with 0. Since the amplified DC offset voltage Vos1 is less than 0, the comparator U3 outputs a digital logical output 0 to the DSP U2.

After that, at step 3, upon obtaining the digital logical output 0, the DSP U2 adjusts the digital code D[7:0] in an increasing direction (a second direction) by a half of the previous digital code (0100,000) such that the current digital code D[7:0]=0110,0000, and thus Icp=0.4 uA, and Icn=0.6 uA. Due to the first compensation current Icp and the second compensation current Icn, the equivalent DC offset voltage Vos on the first operational amplifier AMP1 will become +1 mV, and will be amplified by the first operational amplifier AMP1 by a gain of 10000 times to output the amplified DC offset voltage Vos1 to the comparator U3 to be compared with 0. Since the amplified DC offset voltage Vos1 is greater than 0, the comparator U3 outputs a digital logical output 1 to the DSP U2.

The comparison and adjustment steps can be repeatedly performed for e.g., 8 times (since the digital code D[7:0] has 8 bits) such that the digital code D[7:0] is adjusted each time by a half of the previous digital code D[7:0] in a decreasing or increasing direction based on the digital logical output (1 or 0) made the comparator U2 until the lowest bit D[0] is adjusted.

After each comparison and adjustment step, the DC offset voltage value Vos gradually converges towards zero as shown in FIG. 4. Upon completion of the adjustments at the calibration mode, the latest adjusted value (e.g., 0110,1010) of the digital code D[7:0] can be determined and saved in the DSP U2, and can be used at the operation mode as the digital code Vd in order to create a compensation voltage Vcmp on the resistor load suitable to compensate the DC offset voltage on the resistor load RL to a reduced level.

Figure 5:
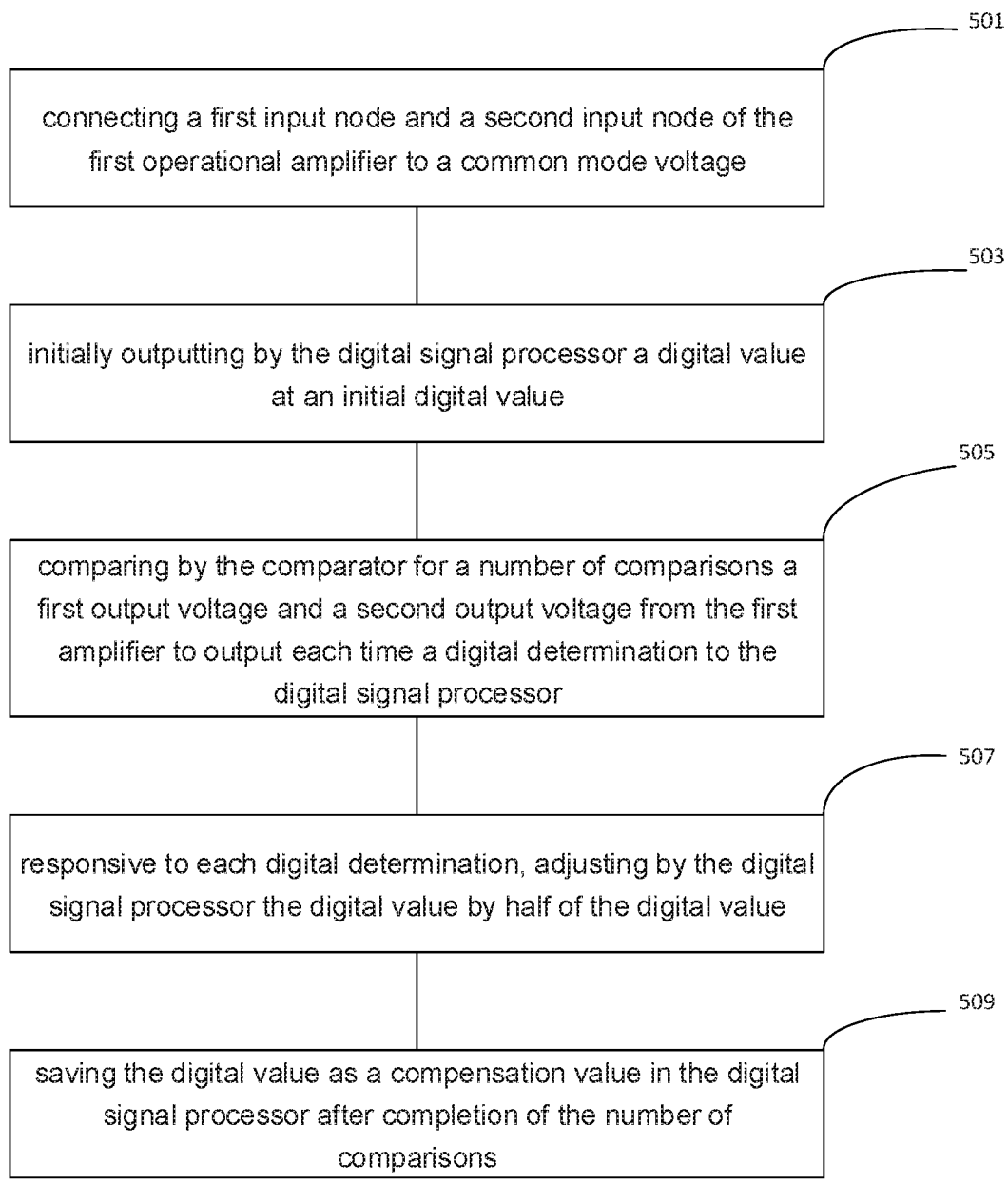
FIG. 5 is a flow chart illustrating a method of calibrating audio power amplifier DC offset according to an embodiment.

FIG. 5 is a flow chart illustrating a method of calibrating audio power amplifier DC offset at a calibration mode according to an embodiment. The method can be performed by an audio amplifier system 100, as shown in FIGS. 1 and 2, which includes a first operational amplifier AMP1, a second operational amplifier AMP2, a comparator U3, a digital signal processor U2, and a DAC U1.

At the calibration mode, at 501, a first input node (+) and a second input node (−) of the first operational amplifier AMP1 may be connected to a common mode voltage Vcom.

At 503, the DSP U2 may initially output a digital code D[7:0] as an initial digital code V0 to cause the DAC U1 to output a first current Icp and a second current Icn that are at a same level respectively to the first input node (+) and the second input node (−) of the first operational amplifier AMP1. Thus, the first operational amplifier AMP1 may output a first output voltage and a second output voltage. The digital value D[7:0] may have having a plurality of bits (such as 8 bits).

At 505, the comparator (U3) may compare the first output voltage and the second output voltage received from the first amplifier AMP1 for a number of comparisons (such as 8 comparisons) and output each time a digital logical output (0 or 1) to the digital signal processor U2. The number of comparisons (such as 8) may be equal to the number of the bits (such as 8) of the digital code D[7:0].

At 507, responsive to each digital logical output, the DSP U2 may adjust (increase or decrease) the digital code D[7:0] by half of the previous digital code. In an embodiment, responsive to a digital logical output being 1, the DSP U2 may increase the digital code D[7:0] by half of the previous digital value D[7:0]. Otherwise, responsive to a digital logical output being 0, the DSP U2 may decrease the digital code D[7:0] by half of the previous digital code D[7:0].

At 509, the DSP U2 may save the latest value of the digital code D[7:0] as a compensation voltage value Vd in the DSP U2 after the completion of the number of comparisons (such as 8 comparisons). At the operation mode, the compensation voltage value Vd saved in the DSP U2 can be used to compensate the DC offset voltage on the resistor load RL to a reduced level.

At the operation mode, the first operational amplifier AMP1 and the second operational amplifier AMP2 are serially coupled to the resistor load RL to function as a power amplifier. The compensation voltage value Vd supplied from the DSP U2 can be used to control the first compensation current Icp and the second compensation current Icn respectively flowing through a first feedback resistor Rf1 and a second feedback resistor Rf2 to eventually create a DC compensation voltage Vcmp on the resistor load RL to compensate the DC offset voltage on the resistor load RL, and thus to reduce the adverse effects (such as pop noises when turning-on or turning-off the audio power amplifier 100) caused by the DC offset voltage on the resistor load RL.

This approach may automatically detect and compensate the DC offset voltage on the resistor load, and thus may efficiently reduce the adverse effects caused by the DC offset voltage on the resistor load RL with reduced complexity.

Features and aspects of various embodiments may be integrated into other embodiments, and embodiments illustrated in this document may be implemented without all of the features or aspects illustrated or described.

One skilled in the art will appreciate that although specific examples and embodiments of the system and methods have been described for purposes of illustration, various modifications can be made without deviating from the spirit and scope of the present application. Moreover, features of one embodiment may be incorporated into other embodiments, even where those features are not described together in a single embodiment within the present document. Accordingly, the application is described by the appended claims.

What is claimed is:

1. A method of calibrating a DC offset voltage of a system, the system comprising a first operational amplifier (AMP1), a second operational amplifier (AMP2) electrically coupled to the first operational amplifier, a comparator (U3), a digital signal processor (U2), and a digital to analog converter (U1) electrically coupled to the first operational amplifier, wherein the digital signal processor is electrically coupled between the digital to analog converter and the comparator, and wherein at a calibration mode, the method comprises:
   connecting a first input node and a second input node of the first operational amplifier to a common mode voltage (Vcom);
   initially outputting by the digital signal processor a digital code (D[7:0]) having a number of bits at an initial digital value (Vmid) to cause the digital to analog converter to output a first compensation current (Icp) and a second compensation current (Icn) respectively to the first input node and the second input node of the first operational amplifier;
   comparing by the comparator for a number of comparisons a first output voltage and a second output voltage from the first operational amplifier to output each time a digital logical output (0 or 1) to the digital signal processor, wherein the number of comparisons being equal to a number of bits of the digital code;
   responsive to each digital logical output, adjusting the digital code by the digital signal processor by half of the digital code; and
   saving the digital code as a compensation voltage value in the digital signal processor after completion of the number of comparisons.

2. The method of claim 1, wherein at the calibration mode, responsive to each digital logical output, adjusting the digital code by the digital signal processor by half of the digital code comprises:
   responsive to each digital logical output being 1, increasing the digital code by the digital signal processor—by half of the digital code; and
   responsive to each digital logical output being 0, decreasing the digital code by the digital signal processor by half of the digital code.

3. The method of claim 1, wherein at an operation mode, the method further comprises:
   responsive to receiving the compensation value from the digital signal processor, outputting by the digital to analog converter the first compensation current and the second compensation current, wherein the first compensation current and the second compensation current respectively flow through a first feedback resistor and a second feedback resistor to create a compensation voltage (Vcmp) on a resistor load to compensate a DC offset voltage (Vos) on the resistor load.

4. The method of claim 1, wherein at an operation mode, the first operational amplifier and the second operational amplifier are serially coupled to the resistor load to function as a power amplifier.

5. The method of claim 1, wherein at an operation mode, an enable signal (pwd1) to the first operational amplifier is set low to enable the first operational amplifier, an enable signal (pwd2) to the second operational amplifier is set low to enable the second operational amplifier, and an enable signal (pwd3) to the comparator is set high to disable the comparator.

6. The method of claim 1, wherein at the calibration mode, an enable signal (pwd1) to the first operational amplifier is set low to enable the first operational amplifier, an enable signal (pwd2) to the second operational amplifier is set high to disable the second operational amplifier, and an enable (pwd3) signal to the comparator is set low to enable the comparator.

7. The method of claim 1, wherein the number of bits of the digital code includes 8.

8. The method of claim 1, wherein the number of bits of the digital code includes 16.

9. The method of claim 1, wherein the number of bits of the digital code includes 32.

10. A system comprising:
   a first operational amplifier (AMP1) having a first input node (+) and a second input node (−);
   a comparator (U3) configured to couple to the first operational amplifier during a calibration mode configured to output a digital logical output (0, 1);

a digital signal processor (U2) configured to receive the digital logical output (0, 1) from the comparator and output a digital code (D[7:0]);

a digital to analog converter (U1) configured to convert the digital code into an analog value during the calibration mode, and electrically coupled to the first operational amplifier; and a first feedback resistor (Rf1) and a second feedback resistor (Rf2) coupled in parallel between the digital to analog converter and a resistor load, wherein the digital signal processor is electrically coupled between the digital to analog converter and the comparator, and wherein during the calibration mode, the first input node and the second input node of the first operational amplifier being supplied with a common mode voltage, the digital to analog converter is configured to determine a first compensation current (Icp) and a second compensation current (Icn) respectively to the first input node and the second input node so as to create a compensation voltage (Vcmp) on the resistor load (RL) to compensate a DC offset voltage (Vos) on the resistor load.

11. The system of claim 10, further comprising a second operational amplifier serially coupled between the first operational amplifier and the resistor load during an operation mode.

12. The system of claim 11, wherein during the operation mode, an enable signal (pwd1) to the first operational amplifier is set low to enable the first operational amplifier, an enable signal (pwd2) to the second operational amplifier is set low to enable the second operational amplifier, and an enable signal (pwd3) to the comparator is set high to disable the comparator.

13. The system of claim 11, wherein during the calibration mode, an enable signal (pwd1) to the first operational amplifier is set low to enable the first operational amplifier, an enable signal (pwd2) to the second operational amplifier is set high to disable the second operational amplifier, and an enable signal to the comparator is set low to enable the comparator.

14. The system of claim 10, wherein the first operational amplifier includes a first input resistor (R1) and a second input resistor (R2).

15. The system of claim 10, wherein during the calibration mode, the first operational amplifier and the comparator are configured to open-loop amplify the DC offset voltage on the resistor load.

16. The system of claim 10, wherein the compensation voltage on the resistor load is opposite to the DC offset voltage on the resistor load.

17. The system of claim 10, wherein the system comprises an audio power amplifier.

* * * * *